United States Patent
Ye et al.

(10) Patent No.: US 12,295,164 B2
(45) Date of Patent: May 6, 2025

(54) METHOD FOR FORMING SEMICONDUCTOR STRUCTURE

(71) Applicant: Semiconductor Technology Innovation Center (Beijing) Corporation, Beijing (CN)

(72) Inventors: Ren Ye, Beijing (CN); Bu Weihai, Beijing (CN); Wu Yongqin, Beijing (CN)

(73) Assignee: Semiconductor Technology Innovation Center (Beijing) Corporation, Beijing (CN)

( * ) Notice: Subject to any disclaimer, the term of this patent is extended or adjusted under 35 U.S.C. 154(b) by 443 days.

(21) Appl. No.: 17/696,314

(22) Filed: Mar. 16, 2022

(65) Prior Publication Data

US 2022/0352343 A1 Nov. 3, 2022

(30) Foreign Application Priority Data

Apr. 30, 2021 (CN) .......................... 202110483658.2

(51) Int. Cl.
*H01L 29/66* (2006.01)
*H01L 21/3065* (2006.01)
(Continued)

(52) U.S. Cl.
CPC ....... *H10D 64/015* (2025.01); *H01L 21/3065* (2013.01); *H10D 30/6735* (2025.01); *H10D 62/118* (2025.01); *H10D 64/017* (2025.01)

(58) Field of Classification Search
CPC ........... H01L 21/02603; H01L 21/3065; H01L 21/823431; H01L 21/823821;
(Continued)

(56) References Cited

U.S. PATENT DOCUMENTS

2021/0098573 A1* 4/2021 Chen ..................... H01L 29/775
2021/0184045 A1* 6/2021 Ramaswamy .... H01L 21/26586

* cited by examiner

Primary Examiner — David C Spalla
(74) Attorney, Agent, or Firm — Crowell & Moring LLP

(57) ABSTRACT

A method for forming a semiconductor structure is provided. The method includes: providing a base; forming a channel structure on the base, where the channel structure includes one or more stacked channel decks, each of the one or more stacked channel decks including a sacrificial layer and a channel layer located on the sacrificial layer, the sacrificial layer including two first sacrificial layers and a second sacrificial layer sandwiched between the two first sacrificial layers, and in an extension direction of the channel structure, the channel structure includes a channel region, where an etching resistance of the second sacrificial layer is less than an etching resistance of the first sacrificial layers; removing the sacrificial layer of the channel region by etching; and after the removing the sacrificial layer of the channel region by etching, forming a gate structure in the channel region, where the gate structure includes a gate dielectric layer surrounding and covering the channel layer and a gate electrode layer located on the gate dielectric layer. During the removing the sacrificial layer by etching, the second sacrificial layer is easy to be removed first to expose surfaces of the first sacrificial layers in a horizontal direction, which increases an area of contact between the first sacrificial layers and an etching medium and thus accelerating etching of the first sacrificial layers.

12 Claims, 3 Drawing Sheets

(51) Int. Cl.
*H01L 29/06* (2006.01)
*H01L 29/423* (2006.01)
*H10D 30/67* (2025.01)
*H10D 62/10* (2025.01)
*H10D 64/01* (2025.01)

(58) Field of Classification Search
CPC .............. H01L 21/845; H01L 27/0886; H01L 27/0924; H01L 27/1211; H01L 29/0665; H01L 29/0669; H01L 29/0673; H01L 29/41791; H01L 29/42392; H01L 29/66439; H01L 29/66545; H01L 29/66795; H01L 29/775; H01L 29/785; H01L 29/7851; H01L 29/7853; H01L 29/7855; H01L 2029/7858; H10D 30/014; H10D 30/6735; H10D 62/118; H10D 62/119; H10D 62/121; H10D 64/015; H10D 64/017

See application file for complete search history.

METHOD FOR FORMING SEMICONDUCTOR STRUCTURE

RELATED APPLICATIONS

The present application claims priority to Chinese Patent Appln. No. 202110483658.2, filed Apr. 30, 2021, the entire disclosure of which is hereby incorporated by reference.

BACKGROUND

Technical Field

Embodiments and implementations of the present disclosure relate to the field of semiconductor manufacturing, and in particular, to a method for forming a semiconductor structure.

Related Art

In semiconductor manufacturing, with the development of very large scale integrated circuits, a feature size of an integrated circuit continues to decrease. To adapt to a smaller feature size, a channel length of a metal-oxide-semiconductor field-effect transistor (MOSFET) also continues to decrease. However, along with the shortening of the channel length of a device, a distance between a source electrode and a drain electrode of the device is also shortened. Therefore, a control capacity of a gate structure on channels becomes poorer, the difficulty of pinching off a channel by gate voltage becomes higher and higher, and then the phenomenon of subthreshold leakage, that is, the so-called short-channel effects (SCE), occurs more easily.

Therefore, to better meet a requirement of proportional reduction in a device size, the semiconductor process gradually transitions from a planar transistor to a three-dimensional transistor with higher efficacy, such as a gate-all-around (GAA) transistor. In the metal gate-all-around transistor, a gate surrounds a region in which a channel is located. Compared with the planar transistor, the gate of the metal gate-all-around transistor has a stronger channel control capability and can better suppress the SCE.

SUMMARY

Forms of the present disclosure provide a method for forming a semiconductor structure, which improve the performance of a semiconductor structure.

To address the foregoing problem, one form of the present disclosure provides a method for forming a semiconductor structure, including: providing a base; forming a channel structure on the base, where the channel structure includes one or more stacked channel decks, each of the one or more stacked channel decks including a sacrificial layer and a channel layer located on the sacrificial layer, the sacrificial layer including two first sacrificial layers and a second sacrificial layer sandwiched between the two first sacrificial layers, and in an extension direction of the channel structure, the channel structure includes a channel region, where an etching resistance of the second sacrificial layer is less than an etching resistance of the first sacrificial layers; removing the sacrificial layer of the channel region by etching; and after the removing the sacrificial layer of the channel region by etching, forming a gate structure in the channel region, where the gate structure includes a gate dielectric layer surrounding and covering the channel layer and a gate electrode layer located on the gate dielectric layer. Compared with the prior art, technical solutions of embodiments and implementations of the present disclosure have at least the following advantages:

In forming methods provided in forms of the present disclosure, the sacrificial layer includes two first sacrificial layers and a second sacrificial layer sandwiched between the two first sacrificial layers, where an etching resistance of the second sacrificial layer is less than an etching resistance of the first sacrificial layers, and the sacrificial layer of the channel region is removed by etching. In the implementations of the present disclosure, the sacrificial layer includes two first sacrificial layers and a second sacrificial layer sandwiched between the two first sacrificial layers, where an etching resistance of the second sacrificial layer is less than an etching resistance of the first sacrificial layers. The second sacrificial layer can be easily removed first during the removing the sacrificial layer of the channel region by etching. Correspondingly, the first sacrificial layers can protect the channel layer during removal of the second sacrificial layer. In addition, the second sacrificial layer is removed to expose surfaces of the first sacrificial layers in a horizontal direction, which increases an area of contact between the first sacrificial layers and an etching medium, thereby accelerating etching of the first sacrificial layers. Moreover, the first sacrificial layers can further be etched in a thickness direction of the first sacrificial layers, which correspondingly improves rate uniformity of etching the first sacrificial layers and facilitates reduction in an influence of a width of the channel structure on the rate of etching the first sacrificial layers, thereby reducing damage to the channel layer during the removing the first sacrificial layers, so as to correspondingly improve the performance of the semiconductor structure.

DETAILED DESCRIPTION

It is desirable to improve a performance of semiconductor structures. With reference to a forming method of a semiconductor structure, some reasons why it is desirable to improve the performance of semiconductor structures are analyzed below.

FIG. 1 to FIG. 4 are schematic structural diagrams corresponding to steps in a forming method of a semiconductor structure.

Figure 1:
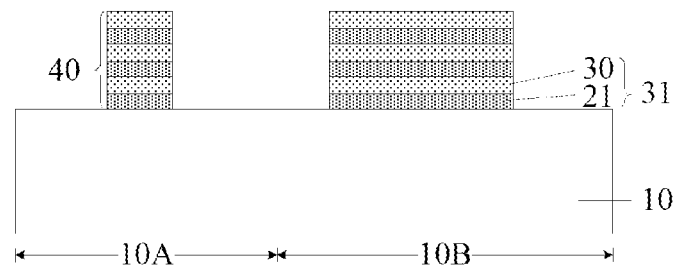
FIG. 1 to FIG. 4 are schematic structural diagrams corresponding to steps in a forming method of a semiconductor structure.

Referring to FIG. 1, a base 10 is provided. The base 10 includes a first device region 10A for forming a first device and a second device region 10B for forming a second device. A channel width of the first device is less than a channel width of the second device. A channel structure 40 is formed on the base 10, the channel structure 40 includes one or more stacked channel decks 31, and each of the one or more stacked channel decks 31 includes a sacrificial layer 21 and a channel layer 30 located on the sacrificial layer 21.

Figure 2:
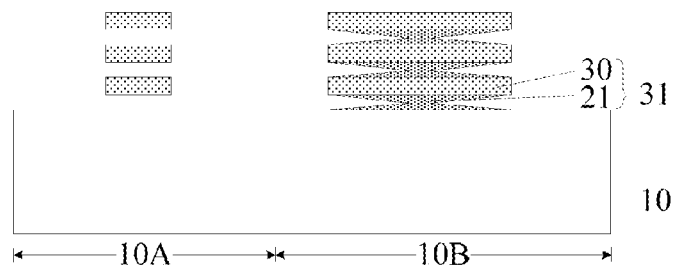
Figure 3:
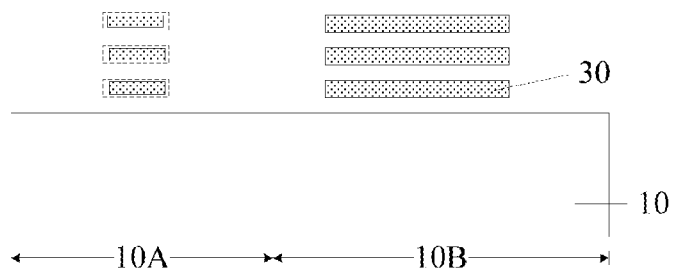

With reference to FIG. 2 and FIG. 3, the sacrificial layer 21 is removed.

The sacrificial layer 21 is removed to expose surfaces of the channel layer 30, thereby causing a gate structure that is subsequently formed to surround and cover the surfaces of the channel layer 30.

Figure 4:
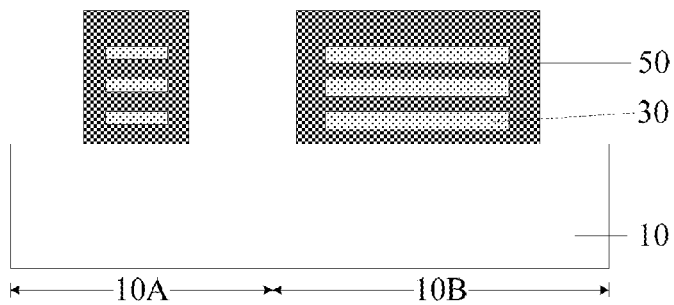

Referring to FIG. 4, after the sacrificial layer 21 is removed, a gate structure 50 surrounding and covering the channel layer 30 is formed.

However, during the removal of the sacrificial layer 21, only side surfaces of the sacrificial layer 21 can be in contact with an etching medium, so that an area contact between the sacrificial layer 21 and the etching medium is relatively small, and a transverse depth of the etching is relatively large. Therefore, a longer etching time is required. Especially for the channel structure 40 with a larger width, the etching time required to etch the sacrificial layer 21 will be longer than that for etching the channel structure 40 with a smaller width. Generally, in a channel release process, the sacrificial layers 21 between the channel layers 30 of different width dimensions are removed together. Therefore, after the sacrificial layer 21 of the first device region 10A with a smaller channel width is removed, the sacrificial layer 21 of the second device region 10B with a larger channel width has not been completely removed (as shown in FIG. 2).

In order to ensure that the sacrificial layers 21 in different regions are completely removed, the etching time needs to be prolonged to ensure that the sacrificial layer 21s of the second device region 10B do not remain, resulting in over-etching of the channel layer 30 of the first device region 10A. As shown in FIG. 3, the dashed frame in FIG. 3 indicates an initial outline of the channel layer 30 of the first device region 10A, which causes over-etching of the channel layer 30 of the first device region 10A, easily causing the channel layer 30 of the first device region 10A to be damaged and reducing their thicknesses. The channel layer 30 is a key structure of the device. The dimensional stability of the channel layer 30 has a greater impact on the performance of the semiconductor structure, and a gate structure 50 covering the channel layer 30 needs to be formed later. The decrease in the thicknesses of the channel layer 30 causes gap sizes between adjacent channel layers 30 to increase, so that when the gate structure 50 is filled between the channel layers 30, a large deviation in the performance and the expected design of the final device is generated, causing effects on the performance of the semiconductor structure.

To address these technical problems, one form of the present disclosure provides a method for forming a semiconductor structure, including: providing a base; forming a channel structure on the base, where the channel structure includes one or more stacked channel decks, each of the one or more channel decks including a sacrificial layer and a channel layer located on the sacrificial layer, the sacrificial layer including two first sacrificial layers and a second sacrificial layer sandwiched between the two first sacrificial layers, and in an extension direction of the channel structure, the channel structure includes a channel region, where an etching resistance of the second sacrificial layer is less than an etching resistance of the first sacrificial layers; removing the sacrificial layer of the channel region by etching; and after the removing the sacrificial layer of the channel region by etching, forming a gate structure in the channel region, where the gate structure includes a gate dielectric layer surrounding and covering the channel layer and a gate electrode layer located on the gate dielectric layer.

In some implementations of a forming method provided in the present disclosure, the sacrificial layer includes two first sacrificial layers and a second sacrificial layer sandwiched between the two first sacrificial layers, where an etching resistance of the second sacrificial layer is less than an etching resistance of the first sacrificial layers, and the sacrificial layer of the channel region is removed by etching. In some implementations of the present disclosure, the sacrificial layer includes two first sacrificial layers and a second sacrificial layer sandwiched between the two first sacrificial layers, where an etching resistance of the second sacrificial layer is less than an etching resistance of the first sacrificial layers. The second sacrificial layer is easy to be removed first during the removing the sacrificial layer of the channel region by etching. Correspondingly, the first sacrificial layers can protect the channel layer during the removing the second sacrificial layer. In addition, the second sacrificial layer is removed to expose surfaces of the first sacrificial layers in a horizontal direction, which increases an area of contact between the first sacrificial layers and an etching medium and thus accelerating etching of the first sacrificial layers. Moreover, the first sacrificial layers can further be etched in a thickness direction of the first sacrificial layers, which correspondingly improves rate uniformity of etching the first sacrificial layers and facilitates reduction in an influence of a width of the channel structure on the rate of etching the first sacrificial layers, thereby reducing damage to the channel layer during the removing the first sacrificial layers, so as to correspondingly improve the performance of the semiconductor structure.

To make the above objectives, features, and advantages of the present disclosure more comprehensible, specific embodiments and implementations of the present disclosure are described in detail below with reference to the accompanying drawings.

FIG. 5 to FIG. 13 are schematic structural diagrams corresponding to steps in one form of a forming method of a semiconductor structure according to the present disclosure.

Figure 5:
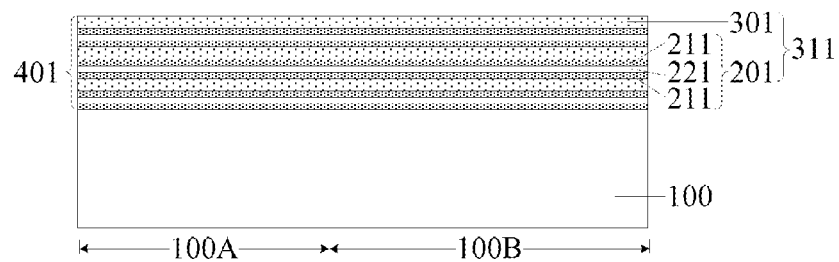
FIG. 5 to FIG. 13 are schematic structural diagrams corresponding to steps in an embodiment of a forming method of a semiconductor structure according to the present disclosure.

Referring to FIG. 5, a base 100 is provided.

The base 100 provides a process operation basis for the forming process of the semiconductor structure. The semiconductor structure includes a gate-all-around (GAA) transistor and a fork-shaped gate (Forksheet) transistor.

The base 100 includes a substrate (not marked).

In some implementations, the substrate is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator. The material of the substrate may be a material suitable for process requirements or easy to be integrated.

In some implementations, the semiconductor structure is a GAA transistor by way of example. The base 100 includes a first device region 100A for forming a first device and a second device region 100B for forming a second device, where a channel width of the first device is less than a channel width of the second device.

Figure 6:
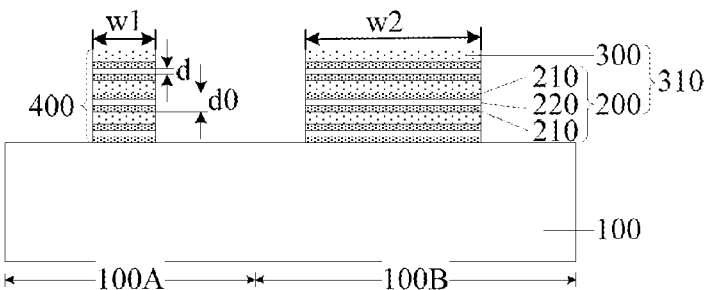
Figure 7:
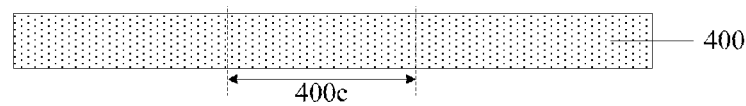

With reference to FIG. 5 to FIG. 7, a channel structure 400 is formed on the base 100 (as shown in FIG. 6). The channel structure 400 includes one or more stacked channel decks 310 (as shown in FIG. 6). Each of the one or more stacked channel decks 310 includes a sacrificial layer 200 (as shown in FIG. 6) and a channel layer 300 located on the sacrificial layer 200 (as shown in FIG. 6). The sacrificial layer 200 includes two first sacrificial layers 210 (as shown in FIG. 6) and a second sacrificial layer 220 sandwiched between the two first sacrificial layers 210 (as shown in FIG. 6). The channel structure 400 includes a channel region 400c (as shown in FIG. 7) in an extension direction of the channel structure 400, where an etching resistance of the second sacrificial layer 220 is less than an etching resistance of the first sacrificial layers 210.

The channel layer 300 in the channel structure 400 is configured to provide channels of the transistors, and the sacrificial layer 200 is configured to provide a process basis for subsequently implementing suspension arrangement of the channel layer 300 and is also configured to occupy a spatial location for the subsequently formed gate structure. In the subsequent process, the sacrificial layer 200 of the channel region 400c are removed, so that the channel layer 300 of the channel region 400c are suspended. A gate structure is formed between the channel layer 300 and the base 100 and between adjacent channel layers 300, so that the gate structure surrounds the channel layer 300 covering the channel region 400c.

A top and a side wall of the channel layer 300 covered by the gate structure are used as channels. In some implementations, all of the top, the bottom and the side wall of the channel layer 300 can be used as channels, which increases an area of the channel layer 300 used as channels, thereby increasing the operating current of the semiconductor structure.

Referring to FIG. 7, FIG. 7 is a top view of any channel structure 400. In an extension direction of the channel structure 400, the channel structure 400 includes a channel region 400c. The channel layer 300 of the channel region 400c is used as a channel of a transistor.

In some implementations, a material of the channel layer 300 includes silicon, germanium, silicon germanium, or a group III-V semiconductor material. As an example, a material of the channel layer 300 is silicon. In other implementations, the material of the channel layer is determined according to the type and performance of the transistor.

It should be noted that, in some implementations, the channel layer 300 and the base 100 are made of the same material. In other implementations, the channel layer and the base may also be made of different materials.

In some implementations, the sacrificial layer 200 is a deck structure, including two first sacrificial layers 210 and a second sacrificial layer 220 sandwiched between the two first sacrificial layers 210. An etching resistance of the second sacrificial layer 220 is less than an etching resistance of the first sacrificial layers 210. During the subsequent removal of the sacrificial layer 200, the second sacrificial layer 220 is easy to be removed first to expose surfaces of the first sacrificial layers 210 in a horizontal direction and thus accelerating etching of the first sacrificial layers 210, and reducing the damage to the channel layer 300 during the removing the sacrificial layer 200.

It should be noted that in the subsequent step of removing the sacrificial layer 200, there is a higher etching selection ratio between the sacrificial layer 200 and the channel layer 300. Correspondingly, there is a higher etching selection ratio between the first sacrificial layers 210 and the channel layer 300.

In some implementations, the material of the channel layer 300 is silicon, and therefore the material of the first sacrificial layers 210 is silicon germanium.

The silicon germanium and silicon can form a larger etching selection ratio, which facilitates subsequent removal of the first sacrificial layers 210 and reduces damage to the channel layer 300.

In other implementations, a suitable material having an etching selection ratio to that of the channel layer may be selected according to the material of the channel layer, so as to reduce the damage to the channel layer during the subsequent removing of the first sacrificial layers.

Similarly, there is also a higher etching selection ratio between the second sacrificial layer 220 and the channel layer 300.

In addition, the etching resistance of the second sacrificial layer 220 is less than the etching resistance of the first sacrificial layers 210.

In some implementations, the material of the first sacrificial layers 210 is silicon, and therefore the material of the second sacrificial layer 220 includes germanium or silicon germanium. When the material of the second sacrificial layer 220 also includes silicon germanium, an atomic percent of germanium in the second sacrificial layer 220 is greater than an atomic percent of germanium in the first sacrificial layers 210.

In a silicon germanium layer, a higher atomic percent of germanium leads to a larger rate of etching the silicon germanium layer. In other words, when the silicon germanium has a higher etching selection ratio to silicon, a higher content of germanium in the silicon germanium leads to a faster rate of etching the silicon germanium.

Moreover, in some implementations, in the etching process of channel release, it is necessary to adopt an etching process capable of achieving a high etching selection ratio between silicon germanium and silicon, and the etching process results in a faster rate of etching the second sacrificial layer 220 with a higher germanium content.

Therefore, in some implementations, the material of the second sacrificial layer 220 includes germanium or silicon germanium. Compared with the sacrificial layer that only includes silicon germanium in the prior art, the sacrificial layer 200 in some implementations has a higher germanium content, which increases the rate of etching the sacrificial layer 200.

In some implementations, the material of the channel layer 300 is silicon, and therefore the material of the second sacrificial layer 220 is germanium, which is more conducive to causing the etching resistance of the second sacrificial layer 220 to be less than the etching resistance of the first sacrificial layers 210.

The silicon germanium and silicon can form a larger etching selection ratio, which facilitates subsequent removal of the second sacrificial layer 220 and reduces damage to the channel layer 300. In addition, the etching resistance of the germanium is less than the etching resistance of silicon germanium, which facilitates the removal of the second sacrificial layer 220 first to expose the surfaces of the first sacrificial layers 210 in the horizontal direction, thus accelerating etching of the first sacrificial layers 210 and reducing the damage to the channel layer 300 caused by the etching process.

In other implementations, a material of the first sacrificial layers having an etching selection ratio to that of the channel layer may be selected according to the material of the channel layer, and a suitable material having an etching selection ratio to that of the channel layer and having the etching resistance less than that of the first sacrificial layers may be selected, so as to reduce the damage to the channel layer during the subsequently removing the second sacrificial layer.

It should be noted that a ratio of a thickness d of the second sacrificial layer 220 to a total thickness d0 of the sacrificial layer 200 cannot be excessively large or excessively small. If the ratio of the thickness d of the second sacrificial layer 220 to the total thickness d0 of the sacrificial layer 200 is excessively large, and the second sacrificial layer 220 is formed through epitaxial growth, epitaxial quality of the second sacrificial layer 220 may be easily affected due to lattice size adaptation, causing additional stress problems. Moreover, the ratio of the thickness d of the second sacrificial layer 220 to the total thickness d0 of the sacrificial layer 200 is excessively large, correspondingly causing the ratio of the thickness of the first sacrificial layers 210 to the total thickness d0 of the sacrificial layer 200 is excessively small. However, in some implementations, the material of the channel layer 300 is silicon, the material of the first sacrificial layers 210 is silicon germanium, and the material of the second sacrificial layer 220 is germanium. During the forming the channel structure 400, a concentration gradient of germanium content between the channel layer 300 and the second sacrificial layer 220 is excessively large, and it is difficult to form the channel structure 400 with higher quality. In addition, the ratio of the thickness of the first sacrificial layers 210 to the total thickness d0 of the sacrificial layer 200 is too small, which easily causes the germanium element in the second sacrificial layer 220 to diffuse into the channel layer 300, affecting quality of the channel layer 300. If the ratio of the thickness d of the second sacrificial layer 220 to the total thickness d0 of the sacrificial layer 200 is too small, the ratio of the thickness of the first sacrificial layers 210 to the total thickness d0 of the sacrificial layer 200 is correspondingly too large, and upon the subsequent removal of the second sacrificial layer 220, it is difficult to increase the rate of removing the first sacrificial layers 210, and it still takes a long time to remove the first sacrificial layers 210, thereby increasing a probability that the channel layer 300 of some regions are overetched. Moreover, if the thickness d of the second sacrificial layer 220 is too small, upon the removal of the second sacrificial layer 220, a gap between the two first sacrificial layers 210 is too small, and it is difficult for the etching medium to completely enter the gap and to be in full contact with the surfaces exposed from the first sacrificial layers 210, thereby causing difficulty of increasing the rate of removing the first sacrificial layers 210. Therefore, in some implementations, the ratio of the thickness d of the second sacrificial layer 220 to the total thickness d0 of the sacrificial layer 200 is 10% to 90%.

Specifically, referring to FIG. 5, the step of forming the channel structure 400 includes: forming a channel structure material layer 401 on the base 100, where the channel structure material layer 401 includes one or more stacked channel deck material layers 311, each of the one or more channel deck material layers 311 including a sacrificial material layer 201 and a channel material layer 301 located on the sacrificial material layer 201, the sacrificial material layer 201 including two first sacrificial material layers 211 and a second sacrificial material layer 221 sandwiched between the two first sacrificial material layers 211, where an etching resistance of the second sacrificial material layer 221 is less than an etching resistance of the first sacrificial material layers 211.

The channel structure material layer 401 is configured to form a channel structure 400. In some implementations, the channel structure material layer 401 is configured to simultaneously form a plurality of channel structures 400 in a plurality of regions, which simplifies the process flow, improves process efficiency, and saves process costs.

The channel deck material layer 311 is used to form the channel decks 310, the sacrificial material layer 201 is used to form the sacrificial layer 200, the channel material layer 301 is used to form the channel layer 300, the first sacrificial material layers 201 are used to form the first sacrificial layers 210, and the second sacrificial material layer 221 is used to form the second sacrificial layer 220.

The channel material layer 301 includes silicon, germanium, silicon germanium, or a group III-V semiconductor material for directly forming the channel layer 300, the material of the first sacrificial layers 211 includes silicon germanium for directly forming the first sacrificial layers 210, the material of the second sacrificial layer 221 includes germanium for directly forming the second sacrificial layer 220, and the etching resistance of the second sacrificial material layer 221 is less than the etching resistance of the first sacrificial material layers 211, so that the etching resistance of the second sacrificial layer 220 is less than the etching resistance of the first sacrificial layers 210.

In some implementations, the channel structure material layer 401 is formed in the same process, which simplifies the process flow, improves the process efficiency, and saves the process costs.

Specifically, forming the channel structure material layer 401 in the same process means that the formation of the channel structure material layer 401 is completed in the same machine in the same process without increasing a new process.

In some implementations, the channel structure material layer 401 is formed by adopting an epitaxial growth process.

The epitaxial growth process can better control the process parameters, which has high process controllability, and it is easy to obtain a more accurate film thickness dimension. Moreover, the epitaxial growth process is easy to form a film with less impurities, resulting in high quality of the channel structure material layer 401. In addition, the material of the first sacrificial material layers 211 is silicon, the material of the second sacrificial material layer 221 is germanium, and the material of the channel material layer 301 is silicon. Through the above material configuration, the first sacrificial material layers 211 can grow on the channel material layer 301 by adopting the epitaxial growth process, the second sacrificial material layer 221 can grow on the first sacrificial material layers 211, the first sacrificial material layers 211 can grow on the second sacrificial material layer 221, and the channel material layer 301 can grow on the first sacrificial material layers 211, so that the channel structure material layer 401 is formed in the same process.

Referring to FIG. 6, the channel structure material layer 401 is patterned to form a channel structure 400 on the base 100.

The channel structure material layer 401 is patterned, so that the channel structure 400 is simultaneously formed in the first device region 100A and the second device region 100B, which simplifies the process flow, improves process efficiency, and saves process costs.

In some implementations, during the forming the channel structure 400 on the base 100, the channel structure 400 is formed on the base 100 of the first device region 100A and the second device region 100B, and in a direction perpendicular to an extension direction of the channel structure 400, a width w1 of the channel structure 400 in the first device region 100A is less than a width w2 of the channel structure 400 in the second device region 100B.

A channel width of the first device is less than the channel width of the second device. The channel width refers to the width of the channel structure 400 in a direction perpendicular to the extension direction of the channel structure 400, and in a direction perpendicular to the extension direction of the channel structure 400, the width w1 of the channel structure 400 in the first device region 100A is less than the width w2 of the channel structure 400 in the second device region 1006.

It should be noted that the channel width has an effect on the rate of removing the sacrificial layer 200. The width w1 of the channel structure 400 in the first device region 100A is less than the width w2 of the channel structure 400 in the second device region 1006, and a volume of the sacrificial layer 200 in the first device region 100A is less than a volume of the sacrificial layer 200 in the second device region 1006. Therefore, in the subsequent process of removing the sacrificial layer 200, a time period for removing the sacrificial layer 200 in the first device region 100A is less than a time period for removing the sacrificial layer 200 in the second device region 1006. In other words, the sacrificial layer 200 in the first device region 100A can be removed faster.

It should be further noted that after the channel structure material layer 401 is patterned, the method may further include: continuing to pattern the base 100 to form fins (not marked) protruding from the rest of the base 100.

In some implementations, after the channel structure 400 and the fins are formed, the method further includes: forming an isolation layer (not marked) on the rest of the base 100 exposed from the channel structure 400 and the fin, where the isolation layer covers entire side walls or part of the side walls of the fin.

The isolation layer is used for insulation between different devices. For example, in a CMOS manufacturing process, the isolation layer is usually formed between an NMOS transistor and a PMOS transistor.

Figure 8:
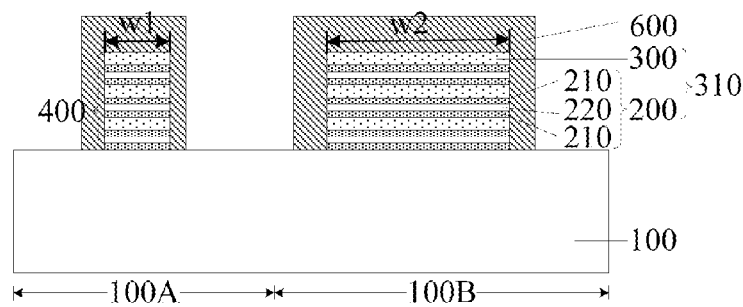

Referring to FIG. 8, after the forming the channel structure 400, the method further includes: forming a dummy gate structure 600 on the base 100 that spans the channel structure 400, the dummy gate structure 600 covering a top and a side wall of the channel structure 400 of the channel region 400c.

Specifically, after the isolation layer is formed, the dummy gate structure 600 is formed.

The dummy gate structure 600 is configured to occupy a spatial position for subsequent formation of a gate structure.

Specifically, the dummy gate structure 600 is a deck structure, including a dummy gate oxide layer (not shown) and a dummy gate layer (not shown) covering the dummy gate oxide layer.

The dummy gate layer may be a single-layer structure or a deck structure. A material of the dummy gate layer includes one or two of amorphous silicon and polysilicon. In other implementations, the material of the dummy gate layer may include one or more of SiO, SiN, SiON, SiC, SiCN, SiOCN, or a-C.

In some implementations, the dummy gate layer is a single-layer structure, and a material of the dummy gate layer is amorphous silicon. The amorphous silicon does not have a crystallographic orientation. Therefore, the uniformity of the etching rate and the uniformity of the etching effect for amorphous silicon are better, thereby improving the effect of subsequent removal of the dummy gate layer.

As an example, a material of the dummy gate oxide layer is silicon oxide.

Figure 9:
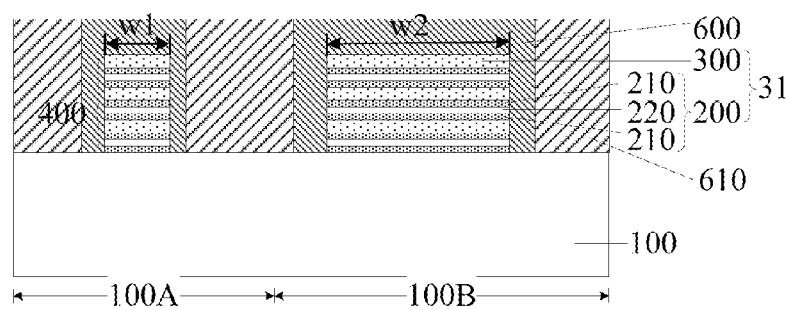

Referring to FIG. 9, the forming method further includes: forming an interlayer dielectric layer 610 covering the channel structure 400 on the base 100, where the interlayer dielectric layer 610 further covers the side walls of the dummy gate structure 600 and exposes a top of the dummy gate structure 600.

The interlayer dielectric layer 610 is configured to isolate adjacent devices, and the interlayer dielectric layer 610 is further configured to provide a process basis for subsequent removal of the dummy gate structure 600 to form a gate opening.

A material of the interlayer dielectric layer 610 is an insulation material include at least one of silicon oxide, silicon nitride, silicon oxynitride, silicon oxycarbide, silicon carbonitride, or silicon oxycarbonitride.

Figure 10:
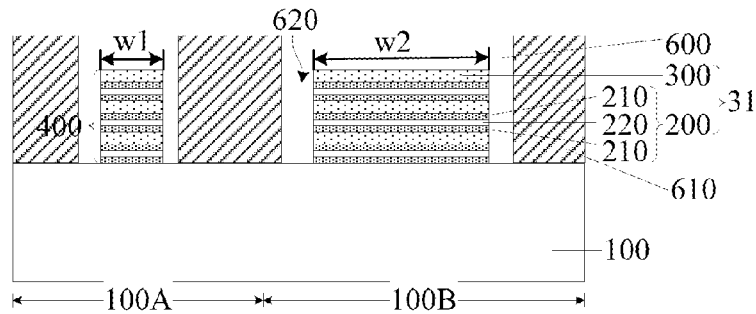

Referring to FIG. 10, the forming method further includes: removing the dummy gate structure 600 to form a gate opening 620 in the interlayer dielectric layer 610, where the gate opening 620 exposes the channel structure 400 of the channel region 400c.

Figure 11:
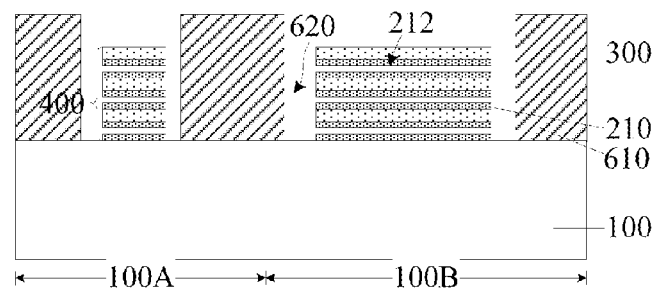
Figure 12:
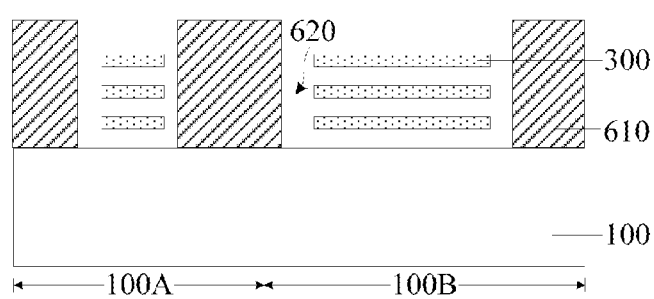

The gate opening 620 provides a spatial location for subsequent formation of the gate structure, and the gate opening 620 exposes the channel structure 400 of the channel region 400c, which provides a basis for the subsequent removal of the sacrificial layer 200. With reference to FIG. 11 and FIG. 12, the sacrificial layer 200 of the channel region 400c is removed by etching.

In the embodiments of the present disclosure, the sacrificial layer 200 includes two first sacrificial layers 210 and a second sacrificial layer 220 sandwiched between the two first sacrificial layers 210. An etching resistance of the second sacrificial layer 220 is less than an etching resistance of the first sacrificial layers 210, and the second sacrificial layer 220 is easy to be removed first during the removing the sacrificial layer 200. Correspondingly, the first sacrificial layers 210 can protect the channel layer 200 during the removing the second sacrificial layer 220. In addition, the second sacrificial layer 220 is removed to expose surfaces 212 of the first sacrificial layers 210 in a horizontal direction (as shown in FIG. 11), which increases an area of contact between the first sacrificial layers 210 and an etching medium and thus accelerating etching of the first sacrificial layers 210. Moreover, the first sacrificial layers 210 can further be etched in a thickness direction of the first sacrificial layers 210, which correspondingly improves rate uniformity of etching the first sacrificial layers 210 and facilitates reduction in an influence of a width of the channel structure 400 on the rate of etching the first sacrificial layers 210, thereby reducing damage to the channel layer 300 during the removing the first sacrificial layers 210, so as to correspondingly improve the performance of the semiconductor structure.

Specifically, in some implementations, the rate of etching the sacrificial layer 200 in the second device region 100B is increased, thereby greatly reducing the probability that the channel layer 300 in the first device region 100A are over-etched.

In some implementations, during the removal of the sacrificial layer 200 of the channel region 400c by etching, the second sacrificial layer 220 and the first sacrificial layers 210 are sequentially removed, and after the second sacrificial layer 220 is removed, in the first device region 100A and the second device region 1006, thicknesses of the rest of the first sacrificial layers 210 that need to be etched in the direction perpendicular to the surface of the base are consistent, so that during the removal of the first sacrificial layers 210, the probability that the channel layer 300 in the first device region 100A are over-etched can be reduced.

In some implementations, the sacrificial layer 200 of the channel region 400c are removed by etching through the gate opening 620 to implement the suspended arrangement of the channel layer 300, which also provides a spatial location for subsequent formation of the gate structure.

In some implementations, in the step of removing the sacrificial layer 200 of the channel region 400c by etching, the second sacrificial layer 220 and the first sacrificial layers 210 are sequentially removed in the same process, which simplifies the process flow, improves the process efficiency, and saves the process costs.

Specifically, in the same process, the sequentially removing the second sacrificial layer 220 and the first sacrificial layers 210 refers to removing the second sacrificial layer 220 and the first sacrificial layers 210 in the same machine in the same process without additionally changing the process or adding a new process.

In some implementations, the sacrificial layer 200 is removed by etching by adopting an isotropic dry etching process. The isotropic dry etching process facilitates complete removal of the sacrificial layer 200.

In some implementations, the isotropic etching process includes a Certas etching process or a SiCoNi etching process.

The Certas etching process or the SiCoNi etching process has good isotropic characteristics, which facilitates complete removal of the sacrificial layer 200, and the Certas etching process or the SiCoNi etching process has a better etching selection ratio for the sacrificial layer 200 and the channel layer 300.

In some implementations, the isotropic etching process is the Certas etching process, and etching gas of the Certas etching process includes HF gas.

In other implementations, the sacrificial layer may also be removed by etching by adopting a wet etching process.

It should be noted that in some implementations, the second sacrificial layer 220 and the first sacrificial layers 210 are removed in the same etching step, but since the second sacrificial layer 220 has a lower etching resistance, the second sacrificial layer 220 is removed first, so that the second sacrificial layer 220 and the first sacrificial layers 210 are sequentially removed.

Figure 13:
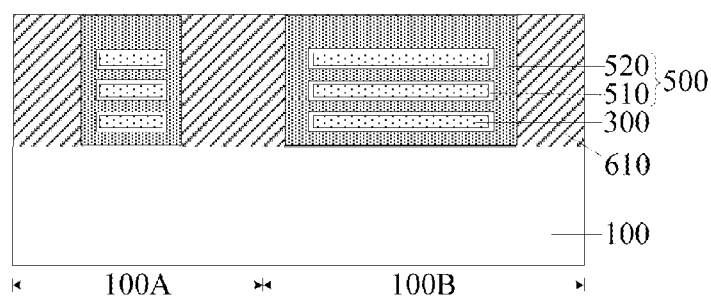

Referring to FIG. 13, a gate structure 500 is formed in the channel region 400c after the sacrificial layer 200 of the channel region 400c are removed by etching. The gate structure 500 includes a gate dielectric layer 510 surrounding and covering the channel layer 300 and a gate electrode layer 520 located on the gate dielectric layer 510.

The gate structure 500 is configured to control opening and closing of channels of the transistors.

The gate structure 500 surrounds and covers the channel layer 300. Therefore, all of the tops, bottoms, and side walls of the channel layer 300 can be used as channels, which increases an area of the channel layer 300 used as channels, thereby increasing the operating current of the semiconductor structure.

In some implementations, the gate structure 500 is formed in the gate opening 620.

The gate dielectric layer 510 is configured to isolate the gate electrode layer 520 from the channel layer 300.

A material of the gate dielectric layer 510 includes at least one of $HfO_2$, $ZrO_2$, HfSiO, HfSiON, HfTaO, HfTiO, HfZrO, $Al_2O_3$, $SiO_2$, or $La_2O_3$.

In some implementations, the gate structure 500 is a metal gate structure. Therefore, the gate dielectric layer 510 includes a high-k gate dielectric layer (not shown), and a material of the high-k gate dielectric layer includes a high-k dielectric material. The high-k dielectric material refers to a dielectric material with a relative dielectric constant greater than that of silicon oxide. Specifically, the material of the high-k gate dielectric layer may include $HfO_2$, $ZrO_2$, HfSiO, HfSiON, HfTaO, HfTiO, HfZrO, $Al_2O_3$, or the like. In an example, the high-k gate dielectric layer is made of $HfO_2$.

In some implementations, the gate dielectric layer 510 may further include a gate oxide layer (not shown) between the high-k gate dielectric layer and the channel layer 300. As an example, a material of the dummy gate oxide layer is silicon oxide. The gate electrode layer 520 is used for electrically leading out the metal gate structure.

In some implementations, in the step of forming the gate electrode layer 520, the gate electrode layer 520 surrounds and covers the gate dielectric layer 510, so that the gate electrode layer 520 surrounds and covers the channel layer 300.

In some implementations, a material of the gate electrode layer 520 includes at least one of TiN, TaN, Ta, Ti, TiAl, W, AL, TiSiN, or TiAlC.

In some implementations, the gate structure 500 is a metal gate structure. Therefore, the gate electrode layer 520 includes a work function layer (not shown) and an electrode layer (not shown) located on the work function layer. Alternatively, the gate electrode layer 520 may also include only the work function layer. The work function layer is used for adjusting a threshold voltage of a transistor.

In other implementations, the gate structure may alternatively be a polysilicon gate structure according to process requirements.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A method for forming a semiconductor structure, the method comprising:
providing a base;
forming a channel structure on the base, wherein the channel structure comprises one or more stacked channel decks, each of the one or more stacked channel decks comprising a sacrificial layer and a channel layer located on the sacrificial layer, the sacrificial layer comprising two first sacrificial layers and a second sacrificial layer sandwiched between the two first sacrificial layers, and in an extension direction of the channel structure, the channel structure comprises a channel region, wherein the second sacrificial layer comprises germanium, and an etching resistance of the second sacrificial layer is less than an etching resistance of the first sacrificial layers;
removing the sacrificial layer of the channel region by etching; and
after removing the sacrificial layer of the channel region by etching, forming a gate structure in the channel region, wherein the gate structure comprises a gate dielectric layer surrounding and covering the channel layer of the one or more stacked channel decks and a gate electrode layer located on the gate dielectric layer;
wherein after forming the channel structure and before the sequentially removing the second sacrificial layer and the first sacrificial layers of the channel region, the method further comprises:
forming a dummy gate structure on the base that spans the channel structure, wherein the dummy gate structure covers a top and a side wall of the channel structure of the channel region;

forming an interlayer dielectric layer on the base, wherein the interlayer dielectric layer further covers a side wall of the dummy gate structure and exposes a top of the dummy gate structure, the side wall of the dummy gate structure is located between the side wall of the channel structure and a side wall of the interlayer dielectric layer;

removing the dummy gate structure to form a gate opening in the interlayer dielectric layer, wherein the gate opening exposes the channel structure of the channel region;

removing the sacrificial layer of the channel region by etching by using the gate opening; and after the removing the sacrificial layer of the channel region by etching, forming the gate structure in the gate opening.

2. The method for forming a semiconductor structure according to claim 1, wherein:

in the step of providing the base, the base comprises a first device region for forming a first device and a second device region for forming a second device, wherein a channel width of the first device is less than a channel width of the second device; and during the forming a channel structure on the base, the channel structure is formed on the base in the first device region and the second device region, and in a direction perpendicular to the extension direction of the channel structure, a width of the channel structure in the first device region is less than a width of the channel structure in the second device region.

3. The method fwidor forming a semiconductor structure according to claim 1, wherein the step of forming the channel structure comprises:

forming a channel structure material layer on the base, wherein the channel structure material layer comprises one or more stacked channel deck material layers, each of the one or more stacked channel deck material layers comprising a sacrificial material layer and a channel material layer located on the sacrificial material layer, the sacrificial material layer comprising two first sacrificial material layers and a second sacrificial material layer sandwiched between the two first sacrificial material layers, wherein an etching resistance of the second sacrificial material layer is less than an etching resistance of the first sacrificial material layers; and patterning the channel structure material layer to form the channel structure on the base.

4. The method for forming a semiconductor structure according to claim 3, wherein the channel structure material layer is formed in the same process.

5. The method for forming a semiconductor structure according to claim 3, wherein the channel structure material layer is formed with an epitaxial growth process.

6. The method for forming a semiconductor structure according to claim 1, wherein in the step of removing the sacrificial layer of the channel region by etching, the second sacrificial layer and the first sacrificial layers are sequentially removed in the same process.

7. The method for forming a semiconductor structure according to claim 1, wherein the sacrificial layer of the channel region is removed by etching with an isotropic dry etching process.

8. The method for forming a semiconductor structure according to claim 1, wherein:

the first sacrificial layers comprise silicon germanium.

9. The method for forming a semiconductor structure according to claim 1, wherein the channel layer comprises at least one of silicon, germanium, silicon germanium, or a group III-V semiconductor material.

10. The method for forming a semiconductor structure according to claim 1, wherein a thickness of the second sacrificial layer is 10% to 90% of a total thickness of the sacrificial layer.

11. The method for forming a semiconductor structure according to claim 1, wherein the gate dielectric layer comprises at least one of $HfO_2$, $ZrO_2$, HfSiO, HfSiON, HfTaO, HfTiO, HfZrO, $Al_2O_3$, $SiO_2$, or $La_2O_3$.

12. The method for forming a semiconductor structure according to claim 1, wherein the gate electrode layer comprises at least one of TiN, TaN, Ta, Ti, TiAl, W, AL, TiSiN, or TiAlC.

* * * * *